(12) United States Patent  (10) Patent No.: US 8,552,451 B2
Tran et al.  (45) Date of Patent: Oct. 8, 2013

(54) LIGHT-EMITTING DIODE WITH INCREASED LIGHT EXTRACTION

(75) Inventors: Chuong Anh Tran, Orange, CA (US); Trung Tri Doan, Los Gatos, CA (US)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 67 days.

(21) Appl. No.: 13/195,742

(22) Filed: Aug. 1, 2011

(65) Prior Publication Data

US 2011/0284867 A1 Nov. 24, 2011

Related U.S. Application Data

(63) Continuation of application No. 12/173,662, filed on Jul. 15, 2008, now Pat. No. 8,008,678, which is a continuation of application No. 11/032,881, filed on Jan. 11, 2008, now Pat. No. 7,413,918.

(51) Int. Cl.
*H01L 33/22* (2010.01)
(52) U.S. Cl.
USPC .................. 257/98; 257/76; 257/E33.074
(58) Field of Classification Search
USPC ............ 257/94–103, 76–82, 13–19, E33.068, 257/E33.074
See application file for complete search history.

(56) References Cited

U.S. PATENT DOCUMENTS

| | | |
|---|---|---|
| 3,954,534 A | 5/1976 | Scifres et al. |
| 5,779,924 A | 7/1998 | Krames et al. |
| 5,793,062 A | 8/1998 | Kish, Jr. et al. |
| 6,071,795 A | 6/2000 | Cheung et al. |
| 6,104,857 A * | 8/2000 | Ishiharada et al. ............ 385/147 |
| 6,221,683 B1 | 4/2001 | Nirschl et al. |
| 6,277,665 B1 | 8/2001 | Ma et al. |
| 6,429,460 B1 | 8/2002 | Chen et al. |
| 6,495,862 B1 * | 12/2002 | Okazaki et al. ............... 257/103 |
| 6,614,172 B2 | 9/2003 | Chiu et al. |
| 6,649,440 B1 | 11/2003 | Krames et al. |
| 6,658,041 B2 | 12/2003 | Uebbing |
| 6,744,071 B2 | 6/2004 | Sano et al. |
| 6,770,542 B2 | 8/2004 | Plossl et al. |
| 6,800,500 B2 | 10/2004 | Coman et al. |
| 6,821,804 B2 | 11/2004 | Thibeault et al. |
| 6,825,501 B2 | 11/2004 | Edmond et al. |
| 6,869,820 B2 | 3/2005 | Chen |
| 6,933,160 B2 | 8/2005 | Hon |
| 6,992,331 B2 | 1/2006 | Hon et al. |

(Continued)

FOREIGN PATENT DOCUMENTS

WO 2005029572 A1 3/2005
WO 2005029573 A1 3/2005

OTHER PUBLICATIONS

Schnitzer et al., "30% External Quantum Efficiency from Surface Textured, Thin-Film Light-Emitting Diodes," Appl. Phys. Lett. Oct. 1993 vol. 63(16): pp. 2174-2176.

(Continued)

*Primary Examiner* — Selim Ahmed

(74) *Attorney, Agent, or Firm* — Stephen A. Gratton

(57) ABSTRACT

Methods are disclosed for forming a vertical semiconductor light-emitting diode (VLED) device having an active layer between an n-doped layer and a p-doped layer; and securing a plurality of balls on a surface of the n-doped layer of the VLED device.

17 Claims, 4 Drawing Sheets

(56) References Cited

U.S. PATENT DOCUMENTS

| | | |
|---|---|---|
| 7,135,713 B2 | 11/2006 | Chen |
| 7,352,006 B2 | 4/2008 | Beeson et al. |
| 7,384,807 B2 | 6/2008 | Yoo |
| 7,388,232 B2 | 6/2008 | Suehiro et al. |
| 7,413,918 B2 | 8/2008 | Tran et al. |
| 2004/0041164 A1* | 3/2004 | Thibeault et al. ............ 257/98 |
| 2004/0227151 A1 | 11/2004 | Konno et al. |
| 2004/0227705 A1 | 11/2004 | Fujimoto et al. |
| 2004/0256601 A1 | 12/2004 | Hubacek et al. |
| 2005/0285127 A1 | 12/2005 | Noto et al. |
| 2009/0014743 A1 | 1/2009 | Tran et al. |

OTHER PUBLICATIONS

Kuo et al., "Nitride-based near-ultraviolet LEDs with ITO transparent contact," Materials Science & Engineering B, Solid-state Materials for Advanced Technology, 2004 vol. 106(1): pp. 69-72.

Kock et al., "Strongly Directional Emission from AlGaAs/GaAs Light-Emitting Diodes," Appl. Phys. Lett., Nov. 1990 vol. 57: pp. 2327-2329.

* cited by examiner

LIGHT-EMITTING DIODE WITH INCREASED LIGHT EXTRACTION

CROSS-REFERENCE TO RELATED APPLICATION

This is a continuation of U.S. patent application Ser. No. 12/173,662 filed Jul. 15, 2008 now U.S. Pat. No. 8,008,678, which is a continuation of U.S. patent application Ser. No. 11/032,881 filed Jan. 11, 2005, now issued as U.S. Pat. No. 7,413,918 on Aug. 19, 2008, which are herein incorporated by reference in their entirety.

BACKGROUND

This invention relates to light-emitting diodes and more particularly to new LED structures for enhancing their light extraction.

Light-emitting diodes (LEDs) are an important class of solid state devices that convert electric energy to light. LEDs typically provide an active layer of semiconductor material sandwiched between two oppositely doped layers. When a bias is applied across the doped layers, holes and electrons are injected into the active layer where they recombine to generate light. The light generated by the active region emits in all directions and light escapes the semiconductor chip through all exposed surfaces.

As semiconductor materials have improved, the efficiency of semiconductor devices has also improved. New LEDs are being made from materials such as InAlGaN, which allows for efficient illumination in the ultraviolet to amber spectrum. Many of the new LEDs are more efficient at converting electrical energy to light compared to conventional lights and they can be more reliable. As LEDs improve, they are expected to replace conventional lights in many applications such as traffic signals, outdoor and indoor displays, automobile headlights and taillights, conventional indoor lighting, etc.

The efficiency of conventional LEDs is limited by their inability to emit all of the light that is generated by their active layer. When an LED is energized, light-emitting from its active layer (in all directions) reaches the emitting surfaces at many different angles. Typical semiconductor materials have a high index of refraction ($n \approx 2.2$-$3.8$) compared to ambient air ($n=1.0$) or encapsulating epoxy ($n \approx 1.5$). According to Snell's law, light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed. Because of this phenomenon, much of the light generated by conventional LEDs does not emit, degrading its efficiency.

One method of reducing the percentage of TIR light is to create light scattering centers in the form of random texturing on the LED's surface. The random texturing is patterned into the surface by using sub micron diameter polystyrene spheres on the LED surface as a mask during reactive ion etching. The textured surface has features on the order of the wavelength of light that refract and reflect light in a manner not predicted by Snell's law due to random interference effects. This approach has been shown to improve emission efficiency by 9 to 30%.

As discussed in U.S. Pat. No. 6,821,804, one disadvantage of surface texturing is that it can prevent effective current spreading in LEDs which have a poor electrical conductivity for the textured electrode layer, such as for p-type GaN. In smaller devices or devices with good electrical conductivity, current from the p and n-type layer contacts will spread throughout the respective layers. With larger devices or devices made from materials having poor electrical conductivity, the current cannot spread from the contacts throughout the layer. As a result, part of the active layer will not experience the current and will not emit light. To create uniform current injection across the diode area, a spreading layer of conductive material can be deposited on the surface. However, this spreading layer often needs to be optically transparent so that light can transmit through the layer. When a random surface structure is introduced on the LED surface, an effectively thin and optically transparent current spreader cannot easily be deposited.

Another method of increasing light extraction from an LED is to include a periodic patterning of the emitting surface or internal interfaces which redirects the light from its internally trapped angle to defined modes determined by the shape and period of the surface. See U.S. Pat. No. 5,779,924 to Krames et al. This technique is a special case of a randomly textured surface in which the interference effect is no longer random and the surface couples light into particular modes or directions. One disadvantage of this approach is that the structure can be difficult to manufacture because the surface shape and pattern must be uniform and very small, on the order of a single wavelength of the LED's light. This pattern can also present difficulties in depositing an optically transparent current spreading layer as described above.

An increase in light extraction has also been realized by shaping the LED's emitting surface into a hemisphere with an emitting layer at the center. While this structure increases the amount of emitted light, its fabrication is difficult. U.S. Pat. No. 3,954,534 to Scifres and Burnham discloses a method of forming an array of LEDs with a respective hemisphere above each of the LEDs. The hemispheres are formed in a substrate and a diode array is grown over them. The diode and lens structure is then etched away from the substrate. One disadvantage of this method is that it is limited to formation of the structures at the substrate interface, and the lift off of the structure from the substrate results in increased manufacturing costs. Also, each hemisphere has an emitting layer directly above it, which requires precise manufacturing.

U.S. Pat. No. 5,793,062 discloses a structure for enhancing light extraction from an LED by including optically non-absorbing layers to redirect light away from absorbing regions such as contacts, and also to redirect light toward the LED's surface. One disadvantage of this structure is that the non-absorbing layers require the formation of undercut strait angle layers, which can be difficult to manufacture in many material systems.

As further discussed in U.S. Pat. No. 6,821,804, another way to enhance light extraction is to couple photons into surface plasmon modes within a thin film metallic layer on the LED's emitting surface, which are emitted back into radiated modes. These structures rely on the coupling of photons emitted from the semiconductor into surface plasmons in the metallic layer, which are further coupled into photons that are finally extracted. One disadvantage of this device is that it is difficult to manufacture because the periodic structure is a one-dimensional ruled grating with shallow groove depths (<0.1 .mu.m). Also, the overall external quantum efficiencies are low (1.4-1.5%), likely due to inefficiencies of photon to surface plasmon and surface plasmon-to-ambient photon conversion mechanisms. This structure also presents the same difficulties with a current spreading layer, as described above.

As further discussed in U.S. Pat. No. 6,821,804, light extraction can also be improved by angling the LED chip's side surfaces to create an inverted truncated pyramid. The angled surfaces provide the TIR light trapped in the substrate material with an emitting surface. Using this approach external quantum efficiency has been shown to increase by 35% to 50% for the InGaAlP material system. This approach works for devices in which a significant amount of light is trapped in the substrate. For GaN devices grown on sapphire substrates, much of the light is trapped in the GaN film so that angling the LED chip's side surfaces will not provide the desired enhancement. Still another approach for enhancing light extraction is photon recycling. This method relies on LEDs having a high efficiency active layer that readily converts electrons and holes to light and vice versa. TIR light reflects off the LED's surface and strikes the active layer, where it is converted back to an electron-hole pair. Because of the high efficiency of the active layer, the electron-hole pair will almost immediately be reconverted to light that is again emitted in random directions. A percentage of the recycled light will strike one of the LEDs emitting surfaces within the critical angle and escape. Light that is reflected back to the active layer goes through the same process again.

U.S. Pat. No. 6,821,804 discloses LEDs having light extraction structures on or within the LED to increase its efficiency. The new light extraction structures provide surfaces for reflecting and refracting light into directions that are more favorable for the light to escape into the package. The structures can be arrays of light extraction elements or disperser layers that have quite higher refractive index than the LED encapsulating material. Both the light extraction elements and the disperser layer can have many different shapes and are placed on the spreader, within the epitaxy layers or under the conductive substrate to increase the efficiency of the LED over conventional LEDs.

SUMMARY

In one aspect, systems and methods are disclosed for fabricating a semiconductor light-emitting diode (LED) device by forming an n-gallium nitride (n-GaN) layer; forming a plurality of balls on a surface of the GaN layer; and securing the balls on the surface of the GaN layer.

Implementations may include one or more of the following. A ball 7 rests on an interface between an ITO layer and a p-GaN layer of the LED. The balls 7 create an effective rough surface on GaN to extract more light from interior. In one implementation, the ball 7 is a sub-micron sphere with a radius of approximately 10 nm ~2 um. The ball dimension is selected to optimally scatter light at approximately ½λ. In another implementation, the refractive index of the ball 7 is approximately 2.4. Suitable materials for the ball include: $TiO_2$, $Ta_2O_5$, ZrO, ZnO, $HfO_2$, GaN, AlN, ZnSe, and $SiO_xN_y$, for example. Various coating methods can be used to spread spheres on the GaN surface 42. Using an organic solution one controls the applied ball density. The sphere density can be controlled and optimized for the trade-off between the brightness and the electrical properties. The balls 7 are secured or held in place by applying a coating 9. The coating 9 could be conformally deposited or non-conformally deposited using various techniques such as CVD, PVD, e-beam evaporation, spin on or spray. The coating 9 should be greater than 80% transparent to the wavelength of the LED and an exemplary coating 9 can be ITO or Ni/Au, among others.

The LEDs can provide more light for the same chip size/power consumption. Alternatively, the LEDs can be made smaller given the same light output requirement and such smaller size consumes less power as well as real estate, resulting in savings. The LEDs can be fabricated with standard processing techniques making them highly cost competitive with standard LEDs.

BRIEF DESCRIPTION OF THE FIGURES

FIGS. 2A1 and 2A2 show light extracting balls in more details.

DESCRIPTION

Figure 1:
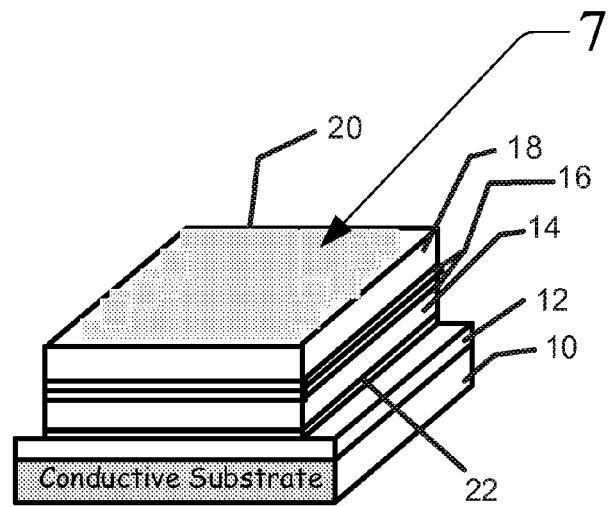
FIG. 1 shows a vertical LED embodiment with light extracting balls.

As shown in FIG. 1, a vertical LED has a substrate 10 (typically Cu, CuW alloy, Mo, CuMo alloy, silicon, GaAs or Ge). Over the substrate 10, a transition metal multi-layer 12, a p-GaN layer 14, an MQW layer 16, a n-GaN layer 18 are then formed. The n-electrode 20 and the p-electrode 22 are then formed on selected areas as electrodes. The balls 7 can be placed above the n-GaN layer 18 to make the smooth n-GaN surface become effectively rough to extract more light without the complicated process of chemical etching the n-GaN surface.

Figure 2A:
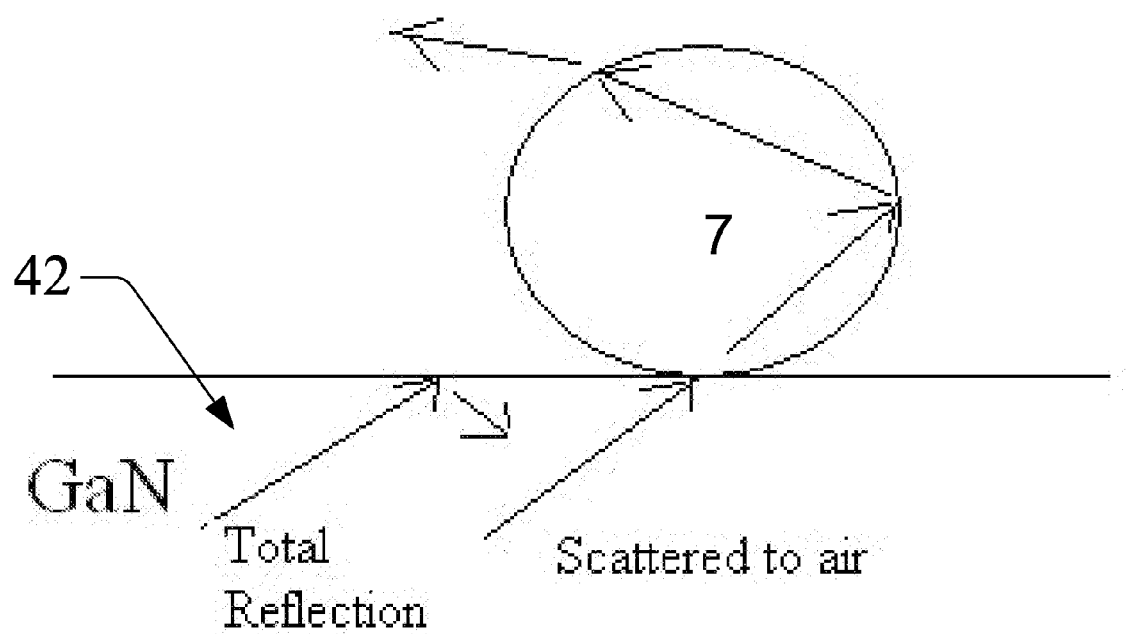
FIG. 2A shows in more details a light extracting ball.
Figures 1, 2A:
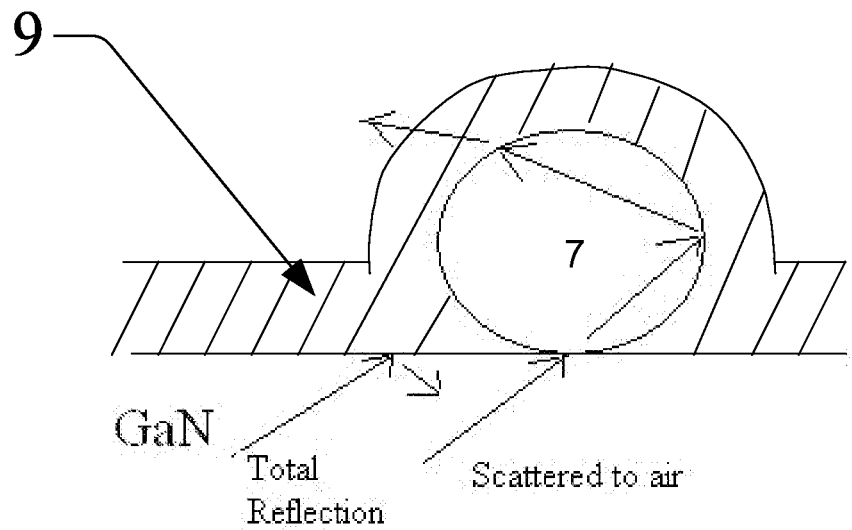

FIG. 2A shows in more details a light extracting ball 7. The ball 7 rests on an interface between an ITO layer and a p-GaN layer of the LED. The balls 7 create an effective rough surface on GaN to extract more light from interior. In one implementation, the ball 6 is a sub-micron sphere with a radius of approximately 30 nm ~1 um. The ball dimension is selected to optimally scatter light at approximately ½λ. The balls can be polymer spheres similar to those currently used for calibration of SEM equipment. In another implementation, the refractive index of the ball 7 is approximately 2.0-3. Suitable materials for the ball include: $TiO_2$, $Ta_2O_5$, ZrO, ZnO, $HfO_2$, GaN, AlN, ZnSe, and $SiO_xN_y$, for example. Various coating methods can be used to spread spheres on GaN surface. The sphere density can be controlled and optimized for the trade-off between the brightness and the electrical properties (Vf & Ir). For example, as coating density increases, the LED brightness and Vf increase. With the ball 7, the light output can be enhanced by more than 30% compared with the conventional LED structure.

The plurality of balls 7 forms an internal light extracting element (LEE) array. The internal LEE arrays are also formed to provide a spatially varying index of refraction. The LEE array is formed during the LED growth process and once the array is formed the remaining layers of the LED structure are grown over the array by an epitaxial deposition technique to embed the LEE array within the LED. Light rays that would otherwise be trapped in the epitaxial layers or substrate can interact with the LEE array to scatter rays that can escape the LED.

Figures 2, 2A:
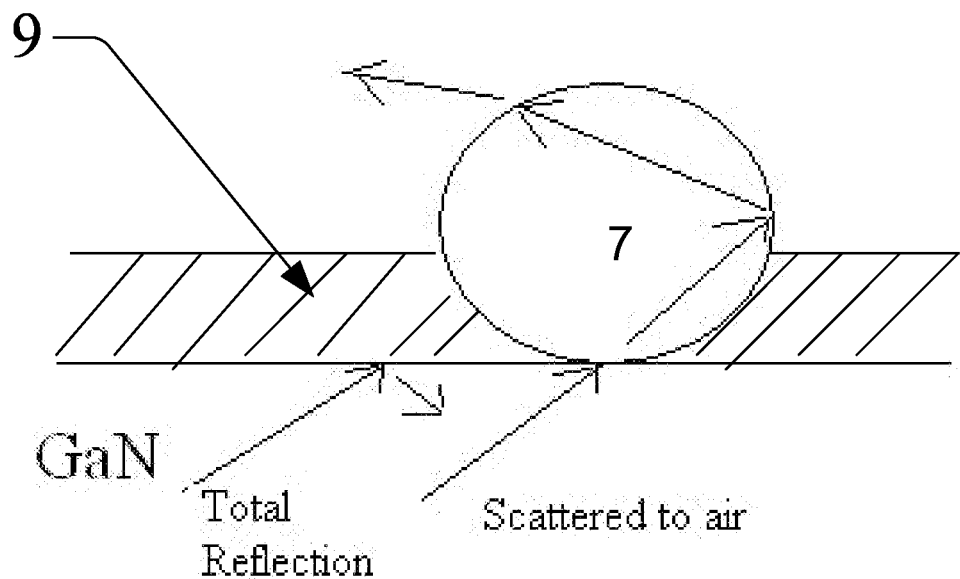

FIG. 2A1 shows light reflection effect when the ball is deposited on the wafer. When light exits the GaN layer through a transparent or semi-transparent coat 9, the light experiences total reflection at the empty regions and is scattered when the light encounters the ball which provides index matching. FIG. 2A2 shows the same effect, even when the coat 9 is not present.

Figure 2B:
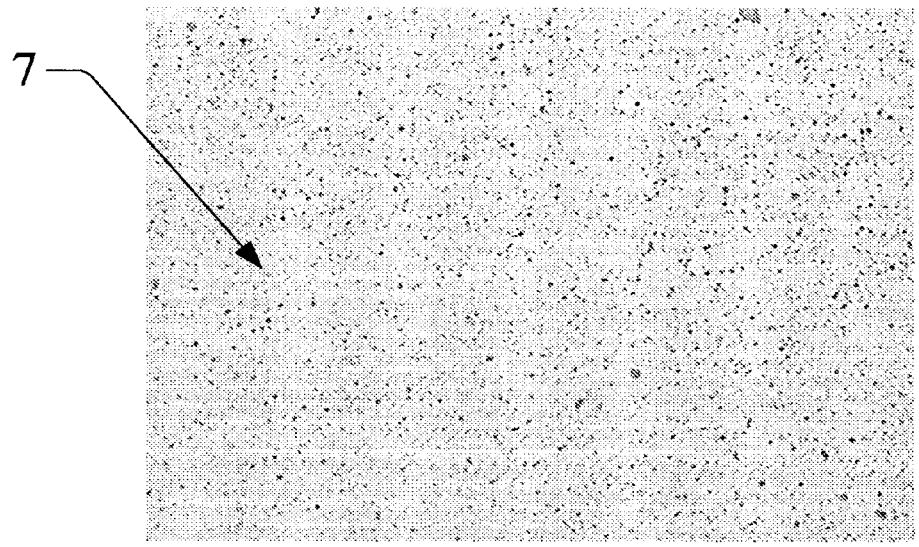
FIG. 2B shows the 200× optical picture of the light extracting balls dispersed on GaN surface by coating method.

As shown in FIG. 2B, the plurality of balls 7 is coated directly above the top GaN layer of ether p-GaN or n-GaN and integrated as a part of epi-wafer by wet method such as spin coating and spray coating with the ball powders dissolved and dispersed into the organic or aqueous solution preliminary. The alternative is to use dry process like electrostatic powder coating or other transport method by air and gas. Besides, these balls can be optionally used as the mask for RIE to make the GaN surface rougher to enhance the extraction efficiency further.

Figure 3:
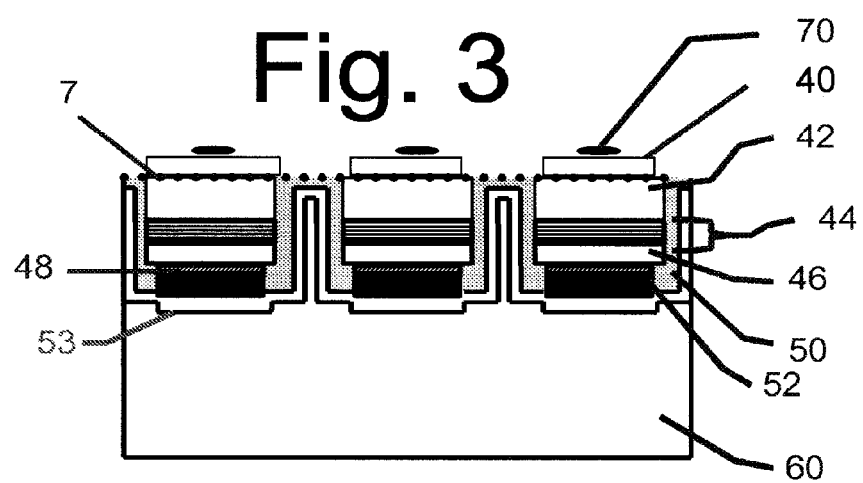
FIG. 3 shows a third LED embodiment with light extracting balls.

FIG. 3 shows a multi-layer epitaxial structure of an exemplary InGaN LED formed on a carrier, which can be a sapphire substrate in one embodiment. The multi-layer epitaxial structure formed above the sapphire substrate includes an n-GaN based layer 42, an MQW active layer 44 and a contact layer 46. The n-GaN based layer 42 may be a doped n-GaN based layer, such as one doped with Si for electricity conduction, having a thickness of 2-6 microns, for example.

The MQW active layer 44 can be an InGaN/GaN MQW active layer. Once electric power is fed between the n-GaN based layer 42 and the contact layer 46, the MQW active layer 44 may be excited and thus generates light. The produced light can have a wavelength between 250 nm to 600 nm. The p-layer can be a $p^+$-GaN based layer, such as a $p^+$-GaN, a $p^+$-InGaN or a $p^+$-AlInGaN layer and the thickness thereof may be between 0.05-0.5 microns. A mesa definition process is performed and p-type reflecting contacts 48 are formed above the contact layer 46. The reflecting contacts 48 can be Ag, Al, ITO/Ag, ITO, Al, Rh, Pd, Ni/Au, among others. Balls 7 are positioned above the n-GaN layer 42. Then the transparent contact layer 40 such as ITO or Ni/Au is deposited to cover the balls 7 and get a good current spreading and light extraction.

A passivation layer 50 is deposited and adhesion metal deposition is performed to form a reflective metal 52 such as Ti and Cr, among others, in a window etched above the passivation layer 50. The passivation layer 50 is non-conductive. The adhesion metal 52 forms a contact surface, and a metal carrier layer 60 is coated thereon. A thin metal layer (Cr, Cr/Au, Ni/Au among others) is coated over the structure to serve as an electrode in the electroplating process. However the coating operation is not needed if an electroless process, sputtering or magneto-sputtering process is used in lieu of electroplating. The multi-layer epitaxial structure is coated with a metal plating layer 60 using techniques such as electroplating and electroless-plating. With electroless-plating, the sapphire substrate is protected using a polyimide layer or a coating that can be easily removed without damaging the sapphire or the electroless plated metal of a relatively thick metal such as Ni or Cu, among others. Next, the sapphire substrate is removed. An n-type electrode 70 is patterned on the top of n-GaN layer 42 to complete the vertical LED.

Figure 4:
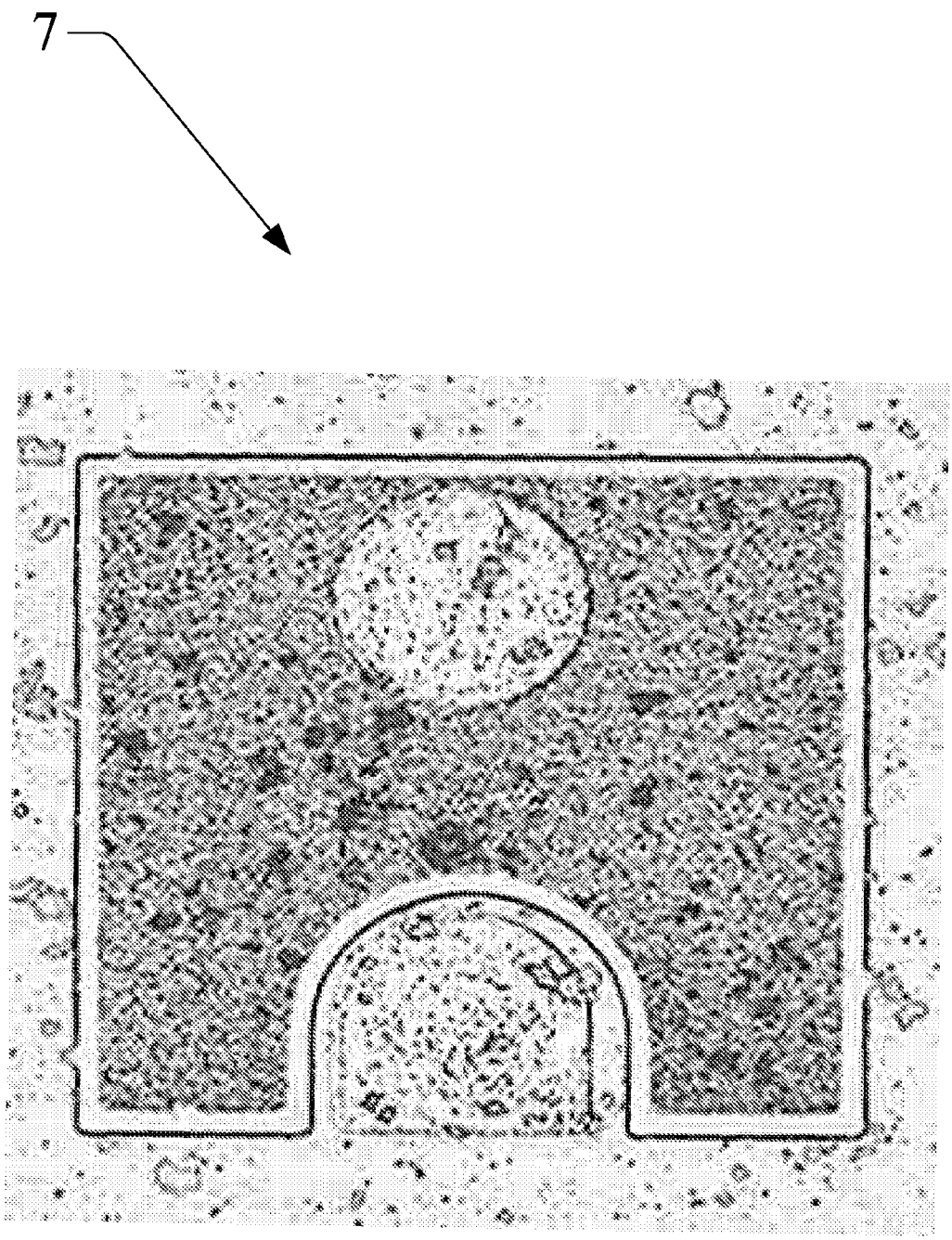
FIG. 4 shows a SEM image of a light extracting LED.

FIG. 4 shows a picture of an exemplary LED with light extraction balls. By coating the refractive index-matching particles such as $TiO_2$ balls, the GaN surface is effectively roughened and the light can be extracted efficiently. This efficiency is due to the better matching of the refractive index, which for GaN is about 2.4 and for $TiO_2$ is about 2.5.

Although the present invention has been described in considerable detail with reference to certain preferred embodiments thereof, other versions are possible. In alternative embodiment, the surface of the GaN layer is roughened using balls/spheres or using wet/dry etching techniques. Other LED configurations utilizing the LEE arrays can also be envisioned by one skilled in the art. The new LED can have different combinations of LEE arrays and disperser layer. LEEs can have different shapes, sizes, spaces between adjacent LEE, and can be placed in different locations. Similarly, the disperser layers can be made of different material and placed in different location. Therefore, the spirit and scope of the appended claims should not be limited to the preferred embodiments described above.

What is claimed is:

1. A light-emitting diode (LED) device comprising:
a p-doped layer;
an active layer on the p-doped layer configured to emit light;
an n-doped layer on the active layer; and
a light extracting element on the n-doped layer comprising a plurality of balls in an electrically conductive transparent coating and the n-doped layer is in direct contact with the coating; the balls having a density in the coating selected to provide a plurality of empty regions and a spatially varying index of refraction, the light extracting element configured to scatter some of the light emitted by the active layer while the empty regions reflect some of the light emitted by the active layer.

2. The LED-device of claim 1 wherein the balls are configured to effectively roughen a surface of the n-doped layer.

3. The LED device of claim 2 wherein the plurality of balls comprise a plurality of polymer spheres.

4. The LED device of claim 2 wherein a refractive index of the balls is between approximately 2.0 and 3.0.

5. The LED device of claim 2 wherein the coating comprises a material selected from the group consisting of indium tin oxide (ITO) and Ni/Au.

6. A light-emitting diode (LED) device comprising:
a p-doped layer;
an active layer on the p-doped layer configured to emit light;
an n-doped layer disposed above on the active layer having a surface; and
a light extracting element on the surface configured to effectively roughen the n-doped layer, the light extracting element comprising a plurality of balls in an electrically conductive transparent coating and the n-doped layer is in direct contact with the coating; the balls having a density in the coating selected to provide a plurality of empty regions, the light extracting element having a spatially varying index of refraction with the balls configured to scatter some of the light emitted by the active layer while the empty regions reflect some of the light emitted by the active layer.

7. The LED device of claim 6 wherein the density is selected to optimize a tradeoff between a brightness and electrical properties of the LED device.

8. The LED device of claim 6 wherein the n-doped layer has a thickness in a range from about 2 microns to about 6 microns and wherein the p-doped layer has a thickness in a range from about 0.05 microns to about 0.5 microns.

9. The LED device of claim 6 wherein both the n-doped layer and the p-doped layer comprises gallium nitride (GaN).

10. The LED device of claim 6 wherein the coating comprises a material selected from the group consisting of indium tin oxide (ITO) and Ni/Au.

11. The LED device of claim 6 wherein the coating comprises a material greater than 80% transparent to a wavelength of the emitted light.

12. The LED device of claim 6 wherein the coating comprises Ni/Au.

13. The LED device of claim 6 wherein the balls have a radius between approximately 10 mm and about 2 microns.

14. The LED device of claim 6 wherein a dimension of the balls scatters light at approximately $\lambda/2$.

15. The LED device of claim 6 wherein a refractive index of the balls is approximately 2.4.

16. The LED device of claim 6 wherein a refractive index of the balls is approximately equal to a refractive index of the n-doped layer.

17. The LED device of claim 6 wherein the balls comprise a material selected from the group consisting of a polymer, $TiO_2$, $Ta_2O$, $ZrO$, $ZnO$, $HfO_2$, $GaN$, $MN$, $ZnSe$, $Of$ and $SiO_xN_y$.

* * * * *